US008941212B2

(12) United States Patent
Yen et al.

(10) Patent No.: US 8,941,212 B2
(45) Date of Patent: Jan. 27, 2015

(54) HELICAL SPIRAL INDUCTOR BETWEEN STACKING DIE

(71) Applicant: Taiwan Semiconductor Manufacturing Co., Ltd., Hsin-Chu (TW)

(72) Inventors: Hsiao-Tsung Yen, Tainan (TW); Cheng-Wei Luo, Hsinchu (TW); Chin-Wei Kuo, Zhubei (TW); Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 94 days.

(21) Appl. No.: 13/760,551

(22) Filed: Feb. 6, 2013

(65) Prior Publication Data
US 2014/0217546 A1 Aug. 7, 2014

(51) Int. Cl.
*H01L 21/84* (2006.01)
*H01L 27/08* (2006.01)
*H01L 21/82* (2006.01)

(52) U.S. Cl.
CPC ............... *H01L 27/08* (2013.01); *H01L 21/82* (2013.01)
USPC .... 257/528; 257/531; 257/758; 257/E23.019; 257/E21.499; 257/E29.344

(58) Field of Classification Search
CPC ................ H01L 23/642; H01L 23/645; H01L 23/49827; H01L 23/49575; H01L 23/5227; H01L 28/10
USPC .......... 257/528, 531, 602, 758, E21.022, 173, 257/174, 499, 575, 23.011, 19, 27.046, 257/29.344
See application file for complete search history.

(56) References Cited

U.S. PATENT DOCUMENTS

| | | | | |
|---|---|---|---|---|
| 5,070,317 A * | 12/1991 | Bhagat | ................. | 336/200 |
| 5,656,849 A * | 8/1997 | Burghartz et al. | ............ | 257/528 |
| 6,030,877 A * | 2/2000 | Lee et al. | ................. | 438/381 |
| 6,114,937 A * | 9/2000 | Burghartz et al. | | |
| 6,166,422 A * | 12/2000 | Qian et al. | ................. | 257/531 |
| 6,218,729 B1 * | 4/2001 | Zavrel et al. | ................. | 257/698 |
| 7,229,908 B1 * | 6/2007 | Drizlikh et al. | ............ | 438/622 |
| 7,262,482 B2 * | 8/2007 | Ahn et al. | ................. | 257/531 |
| 7,513,031 B2 * | 4/2009 | Pleskach et al. | ............ | 29/606 |
| 7,782,166 B2 * | 8/2010 | Loke et al. | ................. | 336/200 |
| 8,558,344 B2 * | 10/2013 | Chen | ................. | 257/531 |

(Continued)

OTHER PUBLICATIONS

Zongru Liu, et al.; "A 60 GHz VCO with 6GHz Tuning Range in 130nm Bulk CMOS"; ICMMT 2008 Proceedings; p. 1-3.

*Primary Examiner* — Michael Lebentritt
(74) *Attorney, Agent, or Firm* — Eschweiler & Associates, LLC

(57) ABSTRACT

The present disclosure relates to a multi-level integrated inductor that provides for a good inductance and Q-factor. In some embodiments, the integrated inductor has a first inductive structure with a first metal layer disposed in a first spiral pattern onto a first IC die and a second inductive structure with a second metal layer disposed in a second spiral pattern onto a second IC die. The first IC die is vertically stacked onto the second IC die. A conductive interconnect structure is located vertically between the first and second IC die and electrically connects the first metal layer to the second metal layer. The conductive interconnect structure provides for a relatively large distance between the first and second inductive structures that provides for an inductance having a high Q-factor over a large range of frequencies.

20 Claims, 5 Drawing Sheets

(56) References Cited

U.S. PATENT DOCUMENTS

| | | | |
|---|---|---|---|
| 8,709,872 B2* | 4/2014 | Rofougaran | 438/109 |
| 2007/0052511 A1* | 3/2007 | Loke et al. | 336/200 |
| 2008/0001698 A1* | 1/2008 | Hazucha et al. | 336/200 |
| 2008/0002380 A1* | 1/2008 | Hazucha et al. | 361/760 |
| 2008/0048813 A1* | 2/2008 | Mosley et al. | 336/65 |
| 2010/0118501 A1* | 5/2010 | Hazucha et al. | 361/764 |
| 2010/0315790 A1* | 12/2010 | Imaoka et al. | 361/748 |
| 2011/0298551 A1* | 12/2011 | Yen et al. | 331/117 FE |
| 2011/0316657 A1* | 12/2011 | Park et al. | 336/200 |
| 2011/0317387 A1* | 12/2011 | Pan et al. | 361/782 |
| 2013/0182365 A1* | 7/2013 | Hazucha et al. | 361/270 |
| 2013/0200521 A1* | 8/2013 | Ding et al. | 257/758 |
| 2014/0203397 A1* | 7/2014 | Yen et al. | 257/531 |

\* cited by examiner

HELICAL SPIRAL INDUCTOR BETWEEN STACKING DIE

BACKGROUND

Inductors are passive electrical components that are configured to generate a magnetic field that stores energy. Inductors are used in a wide variety of integrated circuit applications including voltage regulators and many RF circuits. Inductors having relatively small values are often built directly on integrated circuits using existing integrated chip fabrication processes.

Inductor designers are commonly interested in an inductance as well as a quality factor (Q-factor) of an integrated inductor. The inductance of an integrated inductor is a measure of the amount of energy stored in an inductor. The Q-factor is a ratio of the amount of energy stored in an inductor to the amount of energy dissipated in the inductor (e.g., an ideal inductor has a high Q factor).

DETAILED DESCRIPTION

Figure 1:
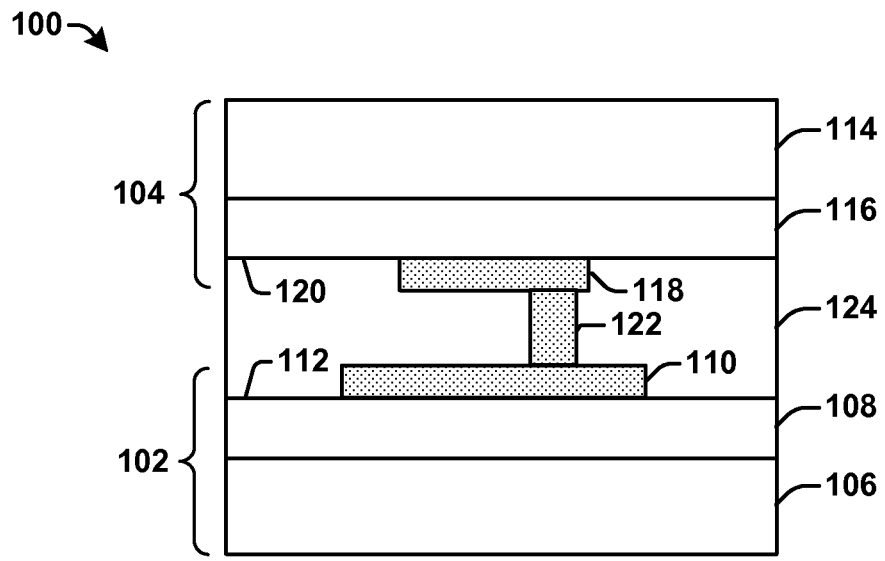
FIG. 1 illustrates a cross-sectional view of some embodiments of a disclosed multi-level integrated inductor located between stacked integrated chip (IC) die.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Integrated inductors are typically formed in one or more metal layers in a back-end-of-the-line (BEOL) metallization stack. Often, a plurality of inductive structures, formed on different metal layers, are connected together in series to increase the overall inductance. For example, a multi-level integrated inductor may comprise a first inductive structure formed in a spiral coil pattern on a first metal layer (e.g., an M1 layer) connected in series with a second inductive structure formed in a spiral coil pattern on a second metal layer (e.g., an M2 layer), vertically separated from the first metal layer. The spiral coil patterns concentrate the magnetic flux induced by a current flowing through the first and second metal layers to store energy within the multi-level inductor.

However, the shrinking size of integrated chip (IC) components has complicated the fabrication of multi-level integrated inductors. For example, in advanced technology nodes, a small vertical distance between metal layers in a BEOL metallization stack provides for a small distance between inductive structures of a multi-level integrated inductor. The small distance causes the integrated inductor to have a low resonance frequency and a high parasitic capacitance (e.g., since capacitance is inversely proportional to distances between electrodes). The high parasitic capacitance stores energy that causes the quality factor (Q-factor) of a multi-level integrated inductor to deviate from the total energy. Furthermore, the use of lower metal layers (having a thin width and high resistance) for inductive structures results in a high resistance that reduces the inductance of an integrated inductor.

Accordingly, the present disclosure relates to a multi-level integrated inductor that provides for a good inductance and Q-factor and a related method of formation. In some embodiments, the integrated inductor comprises a first inductive structure comprising a first metal layer disposed onto a first integrated chip (IC) die and a second inductive structure comprising a second metal layer disposed onto a second IC die. The first IC die is vertically stacked onto the second IC die. A conductive interconnect structure is located vertically between the first and second IC die and is configured to electrically connect the first metal layer to the second metal layer. The conductive interconnect structure is configured to provide for a relatively large distance between the first and second inductive structures that provides for a high Q-factor over a large range of frequencies.

FIG. 1 illustrates a cross-sectional view of some embodiments of disclosed multi-level integrated inductor 100 located between stacked integrated chip (IC) die.

The multi-level integrated inductor 100 comprises a second integrated chip (IC) die 104 stacked onto a first IC die 102. In some embodiments, one or more of the first and second IC die, 102 and 104, may comprise a silicon substrate (e.g., having a plurality of integrated chip devices). In other embodiments, one or more of the first and second IC die, 102 and 104, may comprise an interposer substrate (e.g., glass or silicon interposer substrates) configured to provide for structural stability, improved heat dissipation, improved interconnection, etc.

The first IC die 102 comprises a first inductive structure 110 comprising a first conductive layer disposed over a first side of a first substrate 112. In some embodiments, the first inductive structure 110 is disposed onto a dielectric layer 108 comprising one or more dielectric materials (e.g., oxide) located over a semiconductor substrate 106. In some embodiments, the first conductive layer comprises a metal interconnect layer (e.g., a copper metal interconnect layer) disposed within one or more dielectric layers disposed onto the first side of the first substrate 112. In other embodiments, the first conductive layer may comprise a redistribution layer (e.g., an aluminum redistribution layer) formed above a BEOL metallization stack, or a backside metal. In some embodiments, the first inductive structure 110 may comprise a first spiral inductor having a conductive material formed into a helical pattern that winds in a curve around a fixed center point for a number of n turns. In other embodiments, the first inductive structure 110 may comprise a conductive material formed into a non-helical pattern.

The second IC die 104 comprises a second inductive structure 118 comprising a second conductive layer disposed over a first side of a second substrate 120. In some embodiments, the second inductive structure 118 is disposed onto a dielectric layer 116 comprising one or more dielectric materials located over a semiconductor substrate 114. In some embodiments, the second conductive layer comprises a metal interconnect layer disposed within one or more dielectric layers disposed onto the first side of the second substrate 120. In other embodiments, the second conductive layer may comprise a redistribution layer formed above a BEOL metallization stack, or a backside metal. In some embodiments, the second inductive structure 118 may comprise a second spiral inductor having a conductive material formed in a helical pattern that winds in a curve around a fixed center point for a number of n turns. In other embodiments, the second inductive structure 118 may comprise a conductive material formed into a non-helical pattern.

A conductive interconnect structure 122 is located vertically between the first IC die 102 and the second IC die 104. The conductive interconnect structure 122 is configured to electrically connect the first inductive structure 110 to the second inductive structure 118. In some embodiments, the conductive interconnect structure 122 comprises one or more micro-bumps (e.g., tungsten micro-bumps) or copper pillars.

In some embodiments, the conductive interconnect structure 122 comprises a plurality of micro-bumps or copper pillars comprised within an underfill layer 124 disposed between the first IC die 102 and the second IC die 104. The underfill layer 124 is configured to prevent thermal mismatch between the first IC die 102 and the second IC die 104. In various embodiments, the underfill layer 124 may comprise a moldable underfill comprising a resin or epoxy, for example. The underfill layer 124 may also provide for additional adhesion between the first IC die 102 and the second IC die 104 and protect the conductive interconnect structure 122 from corrosive contaminants (e.g., moisture).

By connecting the first and second inductive structures, 110 and 118, by a conductive interconnect structure 122, a large distance between the first and second inductive structures, 110 and 118, can be achieved. The large distance between the first and second inductive structures, 110 and 118, reduces parasitic capacitance, thereby improving the Q-factor of the multi-level integrated inductor 100. Furthermore, the first and second inductive structures, 110 and 118, can be formed from metal layers having a large thickness. The large thickness of the metal layers reduces the resistance of the inductive structures, 110 and 118, to improve the inductance of the multi-level integrated inductor 100.

Figure 2:
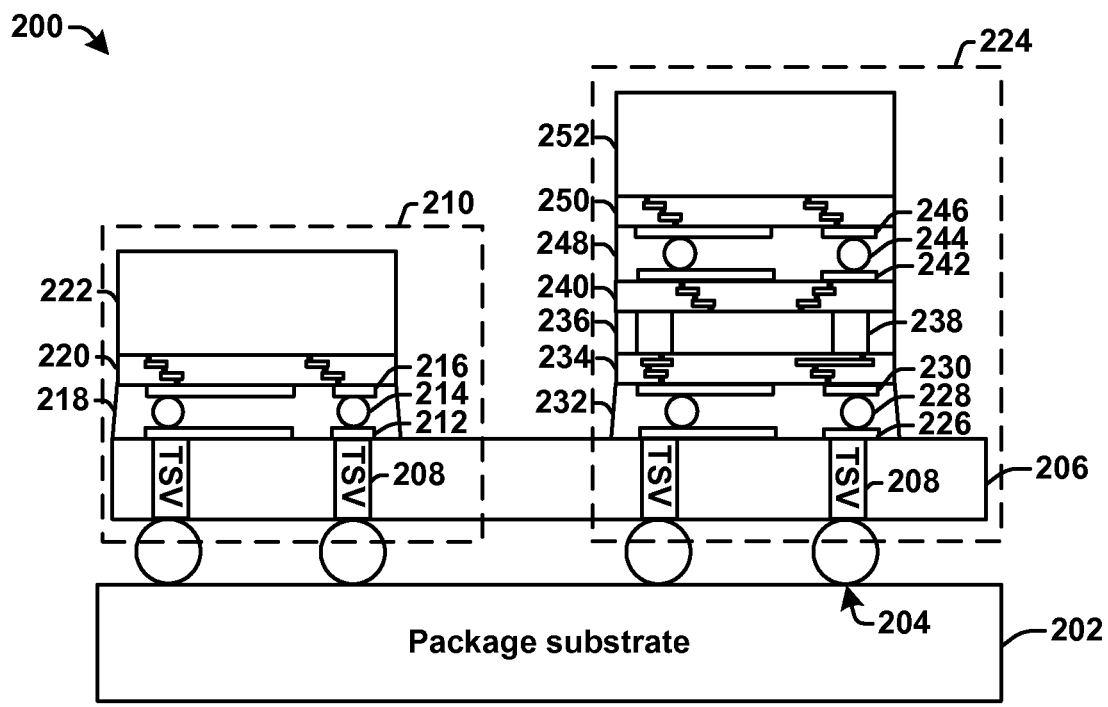
FIG. 2 illustrates a cross-sectional view of some additional embodiments of a disclosed multi-level integrated inductor located between stacked IC die.

It will be appreciated that the disclosed multi-level integrated inductor structure can be implemented between metal layers on a 2.5-dimensional integrated chip (2.5D IC) or a 3-dimensional integrated chip (3D IC). For example, FIG. 2 illustrates a cross-sectional view of some additional embodiments of a semiconductor module 200 comprising multi-level integrated inductors located between stacked IC die in 2.5D IC and 3D IC architectures.

The semiconductor module 200 comprises a package substrate 202 (e.g., a printed circuit board, an organic board, etc.) connected to a first interposer substrate 206 by way of one or more solder balls 204. The first interposer substrate 206 comprises one or more through-silicon vias (TSVs) 208 that provide for a vertical electrical connection extending though the first interposer substrate 206. In some embodiments, the one or more solder balls 204 may comprise flip-chip C4 solder bumps.

In some embodiments, the semiconductor module 200 may comprise a multi-level integrated inductor formed within a 2.5D IC architecture 210. In such embodiments, the one or more TSVs 208 are connected to a first redistribution layer 212, comprising a first inductive structure disposed above the first interposer substrate 206. The first redistribution layer 212 is configured to provide an electrical connection between the one or more TSVs 208 and one or more micro-bumps 214 (e.g., located within an underfill layer 218). In some embodiments, the first redistribution layer 212 may comprise an aluminum redistribution layer (ALRDL). In some embodiments, the first redistribution layer 212 may comprise a combination of a redistribution layer (RDL) and one or more inter-metal layers. The one or more micro-bumps 214 connect the first redistribution layer 212 to a second redistribution layer 216, comprising a second inductive structure disposed onto an upper IC die 222. In some embodiments, the second redistribution layer 216 is connected to one or more metal interconnect layers formed within one or more dielectric layers 220 disposed on the upper IC die 222.

Compared to flip-chip C4 solder balls, the one or more micro-bumps 214 provide for a smaller bump size (e.g., 10 um-70 um) and a tighter pitch (e.g., 10 um-80 um). The smaller bump size provides for a vertical distance between the first inductive structure on the first redistribution layer 212 and the second inductive structure on the second redistribution layer 216 of approximately 10 um-70 um.

In some alternative embodiments, the semiconductor module 200 may comprise a multi-level integrated inductor formed within a 3D IC architecture 224. In such embodiments, the one or more TSVs 208 are connected to a first redistribution layer 226, comprising a first inductive structure disposed above the first interposer substrate 206. The first redistribution layer 226 is configured to provide an electrical connection between the one or more TSVs 208 and one or more micro-bumps 228 (e.g., located within an underfill layer 232). The one or more micro-bumps 228 connect the first redistribution layer 226 to a second redistribution layer 230, comprising a second inductive structure disposed onto a second interposer substrate 236. In some embodiments, the second redistribution layer 230 is connected to one or more metal interconnect layers formed within one or more dielectric layers 234 disposed on a second interposer substrate 236.

In some embodiments, the 3D IC architecture 224 may comprise multiple vertically coupled inductors. For example, in some embodiments, the second redistribution layer 230 is connected to one or more TSVs 238 extending through the second interposer substrate 236. In such embodiments, the one or more TSVs 238 are connected to a third redistribution layer 242 (e.g., by way of one or more metal interconnect layers formed within one or more dielectric layers 240), comprising a third inductive structure disposed above the second interposer substrate 236. The third redistribution layer 242 is configured to provide an electrical connection between the one or more TSVs 238 and one or more metal one or more micro-bumps 244 (e.g., located within an underfill layer 248). The one or more micro-bumps 244 connect the third redistribution layer 242 to a fourth redistribution layer 246, comprising a fourth inductive structure disposed onto an upper IC die 252. In some embodiments, the fourth redistribution layer 246 is connected to one or more metal interconnect layers formed within one or more dielectric layers 250 disposed on the upper IC die 252.

Figure 3:
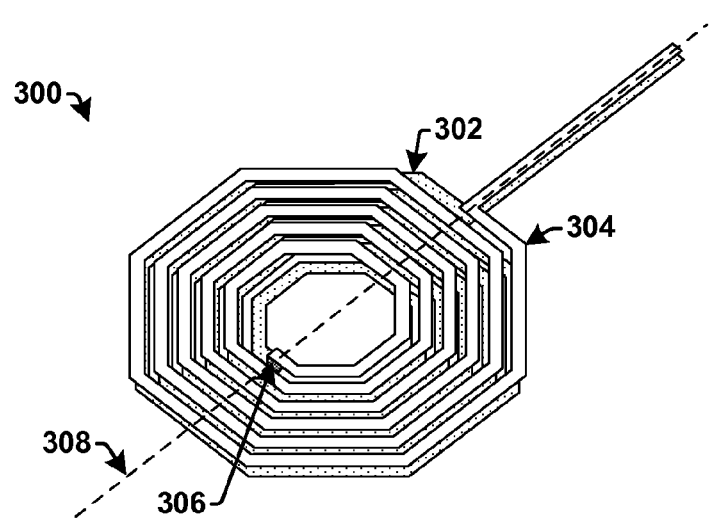
FIG. 3 illustrates a three-dimensional view of some embodiments of disclosed helical inductor located between stacked IC die.

FIG. 3 illustrates a three-dimensional view of some embodiments of a disclosed multi-level helical inductor 300 located between stacking die.

The multi-level helical inductor 300 comprises a first inductive structure 302 and a second inductive structure 304. The first inductive structure 302 comprises a first spiral inductor having a conductive material formed in a helical pattern that winds in a curve around a fixed center point for a number of n turns. The second inductive structure 304 comprises a second spiral inductor having a conductive material formed in a helical pattern that winds in a curve around a fixed center point for a number of n turns. In some embodiments, the first inductive structure 302 is a mirror image of the second inductive structure 304, such that the first and second inductive structures are symmetric about an axis of symmetry 308.

A conductive interconnect structure 306 is positioned between the first inductive structure 302 and the second inductive structure 304. In some embodiments, the conductive interconnect structure 306 comprises a magnetic material having a high magnetic permeability (e.g., having a relative magnetic permeability over 50). For example, in some embodiments, the conductive interconnect structure 306 may comprise a ferrite compound comprising iron.

Figure 4A:
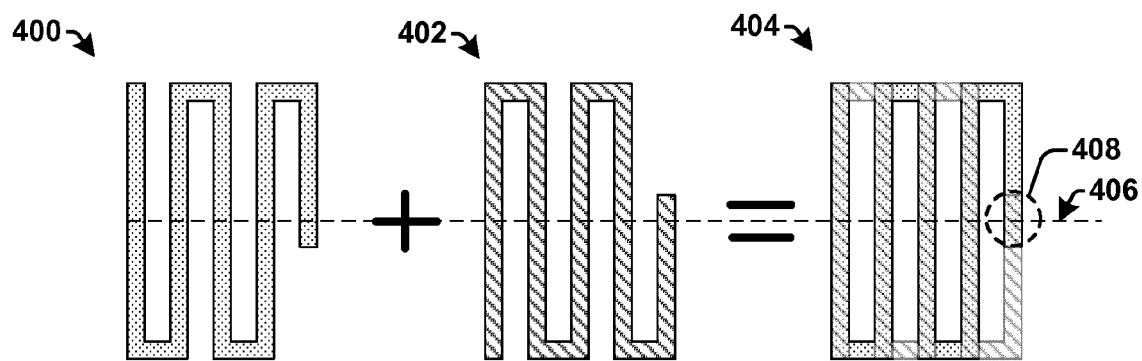
FIGS. 4A-4B illustrate some embodiments of geometries of disclosed inductive structures located on adjacent stackable IC die.
Figure 4B:
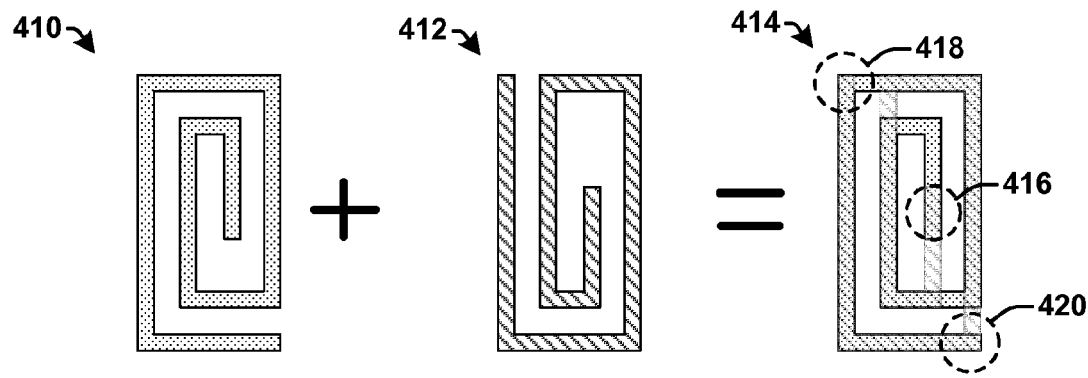

It will be appreciated that the disclosed multi-level inductors may comprise inductive structures having a wide range of geometries. FIGS. 4A-4B illustrate some embodiments inductive structures located on adjacent stackable IC die. It will be appreciated that the geometries illustrated in FIGS. 4A-4B are non-limiting examples and that the disclosed inductive structures may have other geometries.

FIG. 4A illustrates a top view of first inductive structure 400 located on a first IC die and a top view of a second inductive structure 402 located on a second IC die. The first inductive structure 400 comprises a conductive material having a serpentine pattern that winds along its length in a first direction and then in a second direction opposite the first direction. The second inductive structure 402 comprises a conductive material having a serpentine pattern that is a mirror image of the first inductive structure 400 along an axis of symmetry 406. The geometries of the first and second inductive structures, 402 and 404, provide for a positive mutual inductance. In other words, the geometry of the first inductive structure 400 causes a change in a current through the first inductive structure 400 to induce an electromotive force (emf) in the second inductive structure 402, which is the mutual inductance in between, and vice versa.

FIG. 4A also illustrates a top view 404 showing an overlap of the first and second inductive structures, 400 and 402. The first and second inductive structures, 400 and 402, are connected in series by way of a conductive interconnect structure 122 located at 408 along the axis of symmetry 406.

FIG. 4B illustrates a top view of first inductive structure 410 located on a first IC die and a top view of a second inductive structure 412 located on a second IC die. The first inductive structure 410 comprises a conductive material that winds inward in a clockwise helical pattern. The second inductive structure 412 comprises a conductive material that winds inward in a counter-clockwise helical pattern.

FIG. 4B also illustrates a top view 414 showing an overlap of the first and second inductive structures, 410 and 412. As shown in top view 414, the first and second inductive structures, 410 and 412, are connected in series by way of a conductive interconnect structure located at 416 to from a two-port inductor having a first, upper port 418 at and a second, lower port at 420.

Figure 5A:
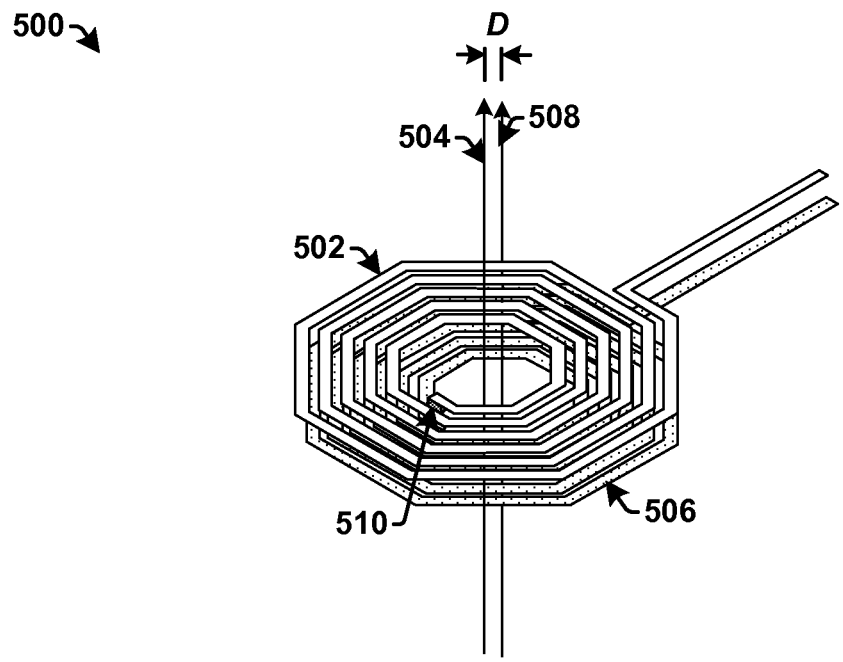
FIGS. 5A-5B illustrate some alternative embodiments of a disclosed integrated inductor.
Figure 5B:
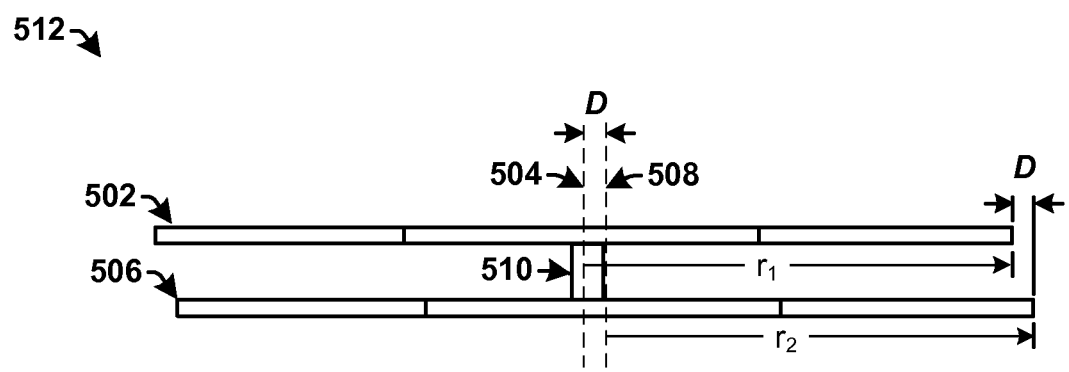

FIGS. 5A-5B illustrate some alternative embodiments of a disclosed multi-level integrated inductor.

FIG. 5A illustrates a three-dimensional view of the multi-level integrated inductor 500. The multi-level integrated inductor 500 comprises a first inductive structure 502 formed on a first IC die and a second inductive structure 506 formed on a second IC die. The first and second inductive structures, 502 and 506, are connected in series by way of a conductive interconnect structure 510. The first inductive structure 502 comprises a conductive material that winds in a plurality of turns around a first axis 504 that is normal to a first IC die. The second inductive structure 506 comprises a conductive material that winds in a plurality of turns around a second axis 508 that is normal to a first IC die. The second axis 508 is offset from the first axis 504 by a non-zero offset d, such that the first and second inductive structures are offset from one another.

FIG. 5B illustrates a cross-sectional view 512 of the multi-level integrated inductor 500. As shown in cross-sectional view 512, the offset between the first axis 504 and the second axis 508 causes edges of the first inductive structure 502 to be offset from edges of the second inductive structure 506 by a offset D. In some embodiments, the first inductive structure 502 may have a different size than the second inductive structure 506. For example, the first inductive structure 502 may comprise a conductive material that winds to a first radius $r_1$ from the first axis 504 that is greater than a second radius $r_2$, from which the second inductive structure 506 winds from the second axis 508. The different radii of the first and second inductive structures, $r_1$ and $r_2$, cause the offset d in the axis to be different than the offset D between edges of the first and second inductive structures, 502 and 506.

It will be appreciated that the disclosed inductor may comprise multiple inductive structures on respective IC die of a stacked die configuration. For example, a first IC die may comprise one or more inductive structures connected in series, while a second IC die stacked onto the first IC die may comprise one or more inductive structures connected in series to the inductive structures on the first IC die.

Figure 6A:
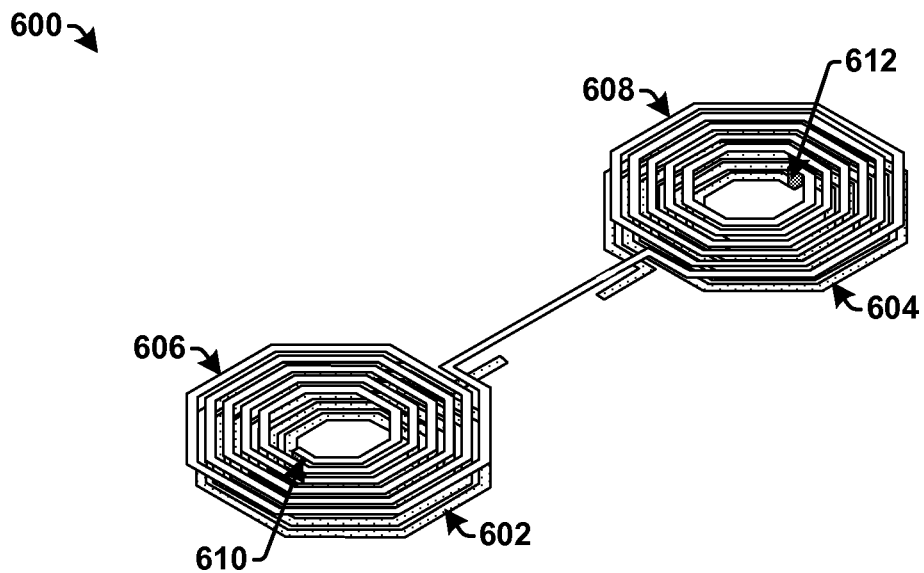
FIG. 6A-6B illustrates some embodiments of a multi-level inductive structure comprising a plurality of inductors connected in series.

FIG. 6A illustrates a three-dimensional view of some embodiments of a multi-level inductor 600 comprising four disclosed inductive structures connected in series.

The multi-level inductor 600 comprises a first inductive structure 602 and a second inductive structure 604 located on a first IC die (not shown). The multi-level inductor 600 further comprises a third inductive structure 606 band a fourth inductive structure 608 located on a second IC die (not shown), positioned vertically above the first IC die. The third and fourth inductive structures, 606 and 608, are connected by a conductive wire extending laterally between the third and fourth inductive structures, 606 and 608. The first and third inductive structures, 602 and 606, are connected vertically by a conductive interconnect structure 610. The second and fourth inductive structures, 604 and 608, are connected vertically by a conductive interconnect structure 612.

Figure 6B:
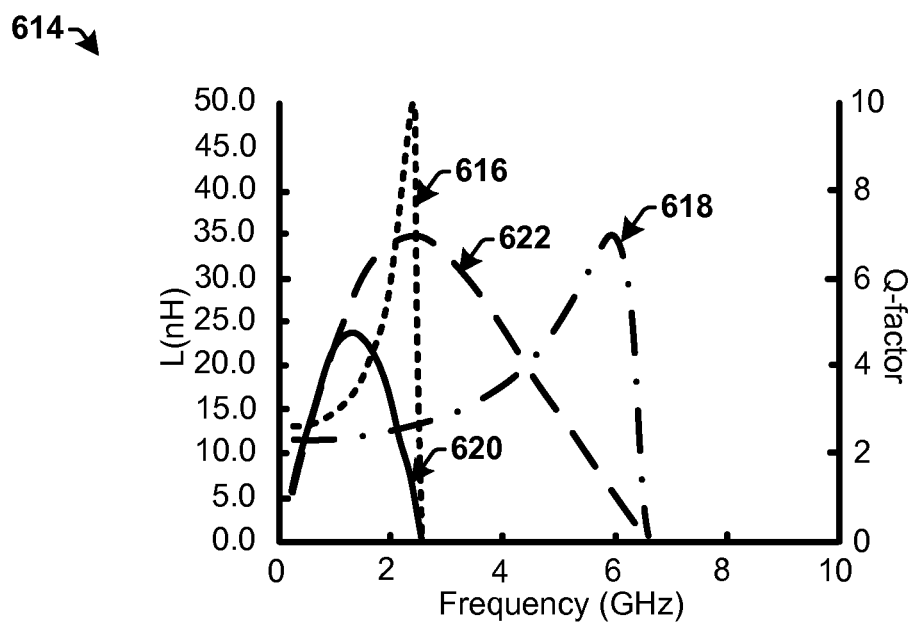

FIG. 6B illustrates a graph 614 showing the inductance and Q factor of multi-level inductor 600.

Along a first y-axis, the graph 614 illustrates the inductance (y-axis) as a function of frequency (x-axis). The inductance of inductors formed on a same die (i.e., a conventional integrated inductor) is illustrated as trend line 616. The inductance of inductors formed on separate die as in a disclosed inductor is illustrated as trend line 618. The conventional inductor provides for an inductance that is limited to a resonance frequency of approximately 2.5 GHz. The disclosed inductor provides for an inductance to a resonance frequency of over 6 GHz.

Along a second y-axis, the graph 614 illustrates the Q-factor (second y-axis) as a function of frequency (x-axis). The Q-factor of inductors formed on a same die (i.e., a conventional integrated inductor) is illustrated as trend line 620. The inductance of inductors formed on separate die as in a disclosed inductor is illustrated as trend line 622. The conventional inductor provides for a Q-factor that is limited to a resonance frequency of approximately 2.5 GHz. The disclosed inductor provides for a large Q-factor to a resonance frequency over 6 GHz.

Figure 7:
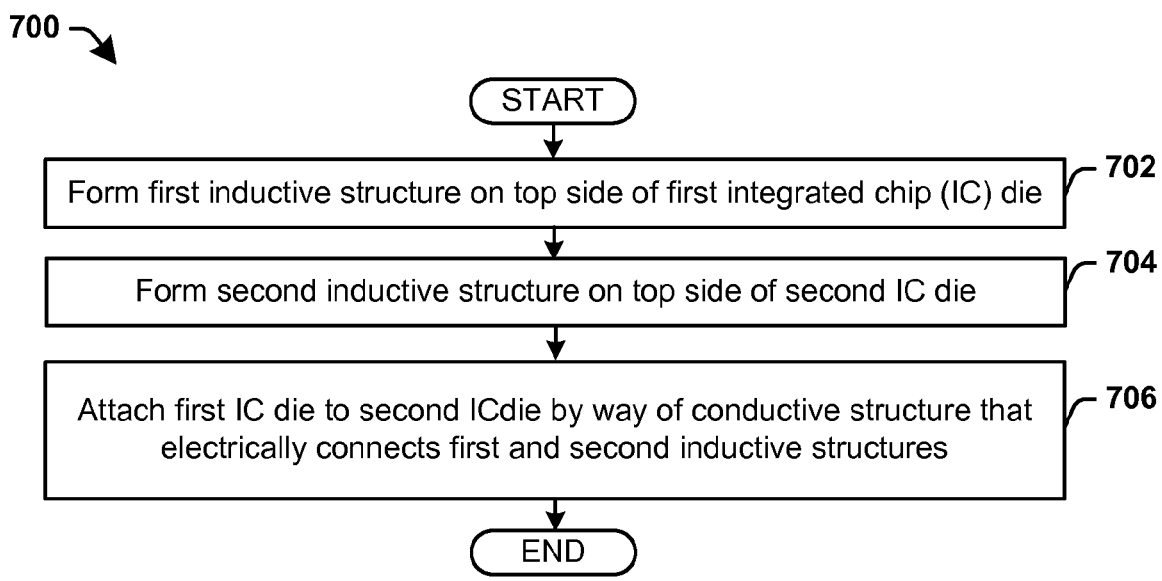
FIG. 7 is a flow diagram of some embodiments of a method for forming a multi-level integrated inductor between stacked IC die.

FIG. 7 is a flow diagram of some embodiments of a method 700 for forming a multi-level inductor between stacked integrated chip (IC) die.

While the method 700 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 702, a first inductive structure is formed on a first side of a first integrated chip (IC) die. In some embodiments, the first inductive structure comprises a helical structure comprising a redistribution layer disposed on the first IC die.

At act 704, a second inductive structure is formed on a first side of a second IC die. In some embodiments, the second inductive structure comprises a helical structure comprising a redistribution layer disposed on the second IC die.

At act 706, the first IC die is attached to the second IC die by way of one or more conductive interconnect structures that electrically connect the first and second inductive structures. The first and second IC die are attached so that the first side of the first IC die faces the first side of the second IC die, causing the one or more conductive interconnect structures to separate the first and second inductive structures. In some embodiments, the first side of the first IC die is brought face to face with the first side of the second IC die. The first and second IC die are then brought into contact via one or more microbumps formed using thermocompression bonding.

It will be appreciated that while reference is made throughout this document to exemplary structures in discussing aspects of methodologies described herein (e.g., those structures presented in FIGS. 6-15), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a multi-level integrated inductor that provides for a good inductance and Q-factor and a related method of formation.

In some embodiments, the present disclosure relates to a multi-level integrated inductor. The multi-level inductor comprises a first inductive structure comprising a first conductive layer disposed onto a first integrated chip (IC) die and a second inductive structure comprising a second conductive layer onto a second IC die vertically stacked onto the first IC die. A conductive interconnect structure is located vertically between the first IC die and the second IC die and configured to electrically connect the first conductive layer to the second conductive layer.

In other embodiments, the present disclosure relates to a multi-level integrated inductor, comprising a first inductive structure comprising a first metal layer disposed in a first helical pattern on a first side of a first integrated chip (IC) die and a second inductive structure comprising a second metal layer disposed in a second helical pattern on a first side of a second IC die, which faces a first side of the first IC die. A conductive interconnect structure is located vertically between the first and second IC die and configured to electrically connect the first metal layer to the second metal layer.

In other embodiments, the disclosure relates to a method of forming a multi-level integrated inductor. The method comprises forming a first inductive structure on a first side of a first integrated chip (IC) die. The method further comprises forming second inductive structure on a first side of a second IC die. The method further comprises attaching the first side of the first IC die to the first side of the second IC die by way of a conductive interconnect structure that electrically connects the first inductive structure and the second inductive structure.

What is claimed is:

1. A multi-level integrated inductor, comprising:
   a first inductive structure comprising a first conductive layer disposed onto a first integrated chip (IC) die;
   a second inductive structure comprising a second conductive layer onto a second IC die vertically stacked onto the first IC die; and
   a conductive interconnect structure located vertically between the first IC die and the second IC die and configured to electrically connect the first conductive layer to the second conductive layer.

2. The multi-level integrated inductor of claim 1, wherein the conductive interconnect structure comprises one or more micro-bumps or copper pillars.

3. The multi-level integrated inductor of claim 1, wherein the conductive interconnect structure comprises a ferrite compound.

4. The multi-level integrated inductor of claim 1, further comprising:
   an underfill layer disposed between the first conductive layer and the second conductive layer and configured to enclose the conductive interconnect structure.

5. The multi-level integrated inductor of claim 1,
   wherein the first inductive structure comprises a first helical pattern that winds around a first axis, which is normal to the first IC die, for a first plurality of turns; and
   wherein the second inductive structure comprises a second helical pattern that winds around a second axis, which is normal to the second IC die, for a second plurality of turns.

6. The multi-level integrated inductor of claim 5, wherein the first axis and the second axis are separated by a non-zero offset.

7. The multi-level integrated inductor of claim 1, further comprising:

a third inductive structure comprising a third conductive layer onto a third IC die vertically stacked onto the second IC die; and a second conductive interconnect structure located vertically between the second IC die and the third IC die and configured to electrically connect the second conductive layer to the third conductive layer.

8. The multi-level integrated inductor of claim 1,
wherein the first inductive structure comprises a first serpentine pattern that winds along its length in a first direction and then in a second direction opposite the first direction; and
wherein the second inductive structure comprises a second serpentine pattern that winds along its length in the first direction and then in the second direction.

9. The multi-level integrated inductor of claim 1,
wherein the first conductive layer is disposed in a first pattern and the second conductive layer is disposed in a second pattern; and
wherein the first pattern is a mirror image of the second pattern.

10. The multi-level integrated inductor of claim 1, wherein the conductive interconnect structure provides for a distance between the first inductive structure and the second inductive structure having a range of approximately 20 um to approximately 40 um.

11. The multi-level integrated inductor of claim 1,
wherein the first inductive structure comprises a first aluminum redistribution layer formed onto the first IC die; and
wherein the second inductive structure comprises a second aluminum redistribution layer formed onto the second IC die.

12. A multi-level integrated inductor, comprising:
a first inductive structure comprising a first metal layer disposed in a first helical pattern on a first side of a first integrated chip (IC) die;
a second inductive structure comprising a second metal layer disposed in a second helical pattern on a first side of a second IC die, which faces a first side of the first IC die; and
a conductive interconnect structure located vertically between the first and second IC die and configured to electrically connect the first metal layer to the second metal layer.

13. The multi-level integrated inductor of claim 12, wherein the conductive interconnect structure comprises one or more micro-bumps or copper pillars.

14. The multi-level integrated inductor of claim 12, further comprising:
an underfill layer disposed between the first metal layer and the second metal layer and configured to enclose the conductive interconnect structure.

15. The multi-level integrated inductor of claim 12, wherein the conductive interconnect structure comprises a ferrite compound.

16. The multi-level integrated inductor of claim 12, wherein the conductive interconnect structure provides for a distance between the first inductive structure and the second inductive structure having a range of approximately 20 um to approximately 40 um.

17. A multi-level integrated inductor, comprising:
a first inductive structure comprising a first conductive layer arranged in a first pattern onto a first side of a first integrated chip (IC) die;
a second inductive structure located at a position vertically over the first inductive structure, and comprising a second conductive layer arranged in a second pattern that is a mirror image of the first pattern onto a first side of a second IC die facing the first side of the first IC die; and
one or more micro-bumps disposed within an underfill layer vertically located between the first inductive structure and the second inductive structure.

18. The multi-level integrated inductor of claim 17, further comprising:
a first plurality of metal interconnect layers connected to the first inductive structure, wherein the first plurality of metal interconnect layers are disposed within a first plurality of dielectric layers located between the first inductive structure and the first IC die;
a second plurality of metal interconnect layers connected to the second inductive structure, wherein the second plurality of metal interconnect layers are disposed within a second plurality of dielectric layers located between the second inductive structure and the second IC die.

19. The multi-level integrated inductor of claim 18, wherein the first pattern and the second pattern are spiral patterns.

20. The multi-level integrated inductor of claim 19, further comprising:
a through-silicon-via (TSV) vertically extending through the second IC die, wherein the second inductive structure is coupled to the TSV by way of the second plurality of metal interconnect layers.

* * * * *